(12) United States Patent
Ito

(10) Patent No.: US 9,105,724 B2
(45) Date of Patent: Aug. 11, 2015

(54) FIELD EFFECT TRANSISTOR STRUCTURE HAVING ONE OR MORE FINS

(71) Applicant: Broadcom Corporation, Irvine, CA (US)

(72) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 34 days.

(21) Appl. No.: 14/030,569

(22) Filed: Sep. 18, 2013

(65) Prior Publication Data
US 2015/0076610 A1    Mar. 19, 2015

(51) Int. Cl.
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
CPC .......................... H01L 29/785; H01L 29/66795
USPC .......................................... 257/202–207, 365
See application file for complete search history.

(56) References Cited

U.S. PATENT DOCUMENTS

| | | | |
|---|---|---|---|
| 2006/0273372 A1* | 12/2006 | Voldman et al. | 257/308 |
| 2010/0006945 A1* | 1/2010 | Merelle et al. | 257/368 |
| 2013/0020640 A1* | 1/2013 | Chen et al. | 257/347 |
| 2014/0191315 A1* | 7/2014 | Ito | 257/336 |

* cited by examiner

*Primary Examiner* — Matthew W Such
*Assistant Examiner* — David Spalla
(74) *Attorney, Agent, or Firm* — Sterne, Kessler, Goldstein & Fox P.L.L.C.

(57) ABSTRACT

A field effect transistor (FET) having one or more fins provides an extended current path as compared to conventional finFETs. A raised source terminal is disposed on a fin adjacent to a sidewall spacer of a gate structure. The drain terminal and a first portion of the gate structure overlie a first well of a first conductivity type. A raised drain terminal is disposed such that it is spaced apart from the gate structure sidewalls. In some embodiments the drain terminal is disposed on a second, separate fin. the drain terminal and a second portion of the gate structure overlie a second well of a second conductivity type.

11 Claims, 12 Drawing Sheets

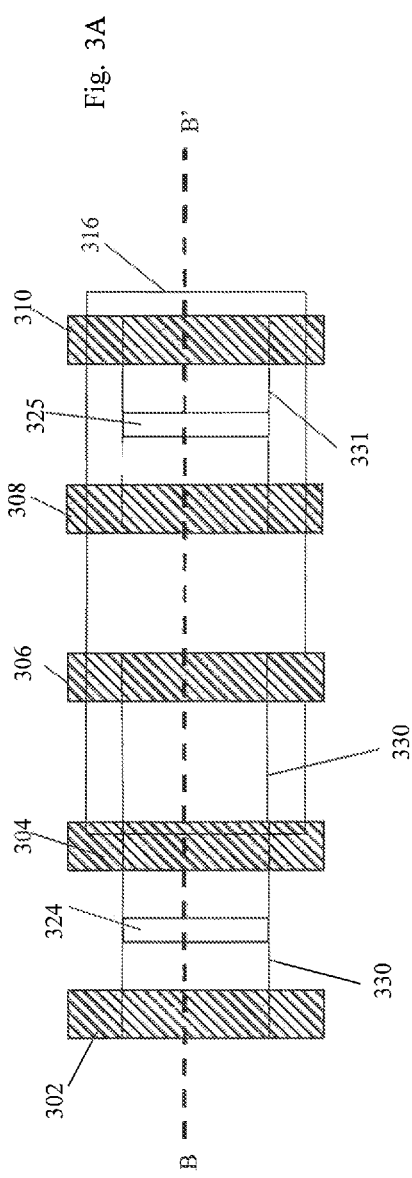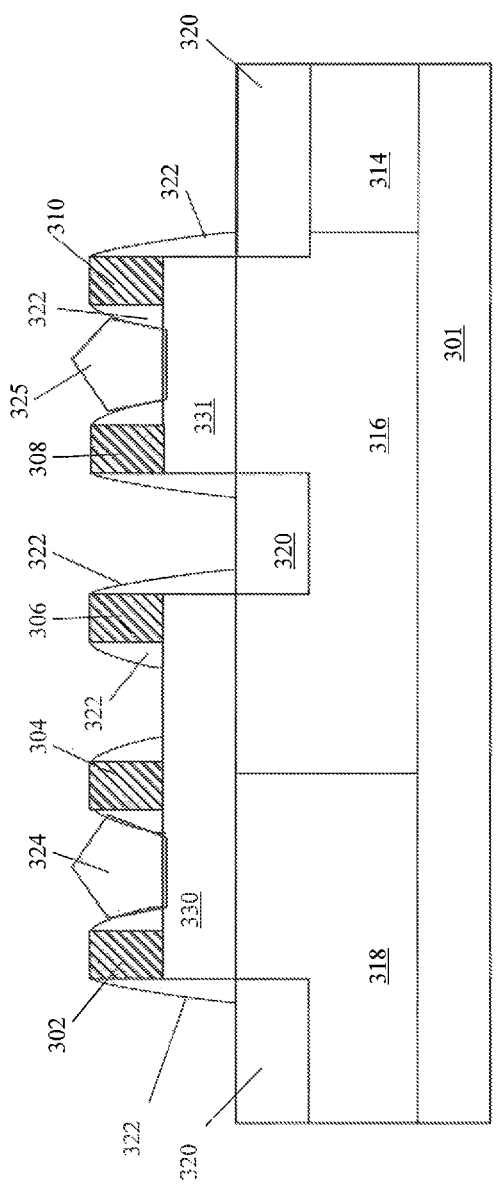

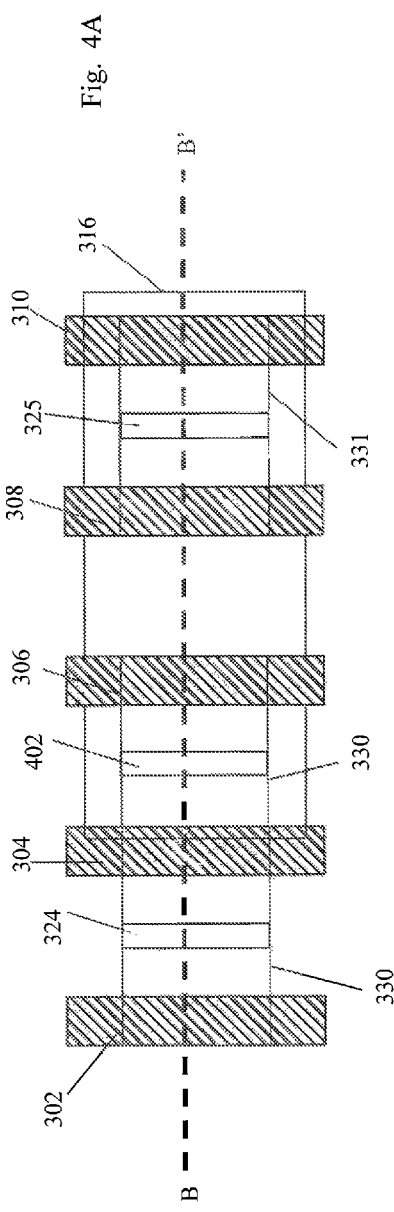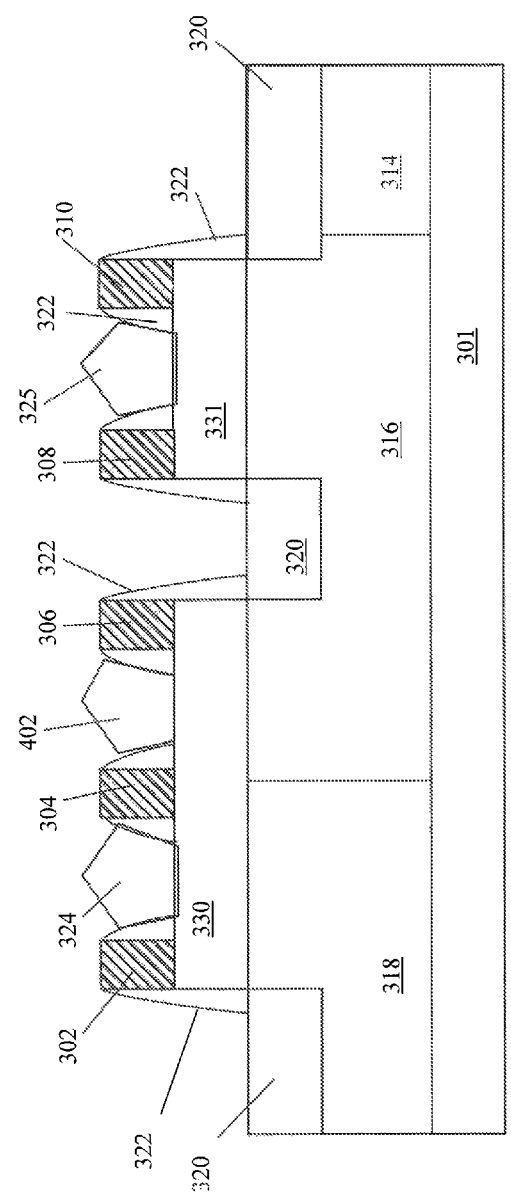

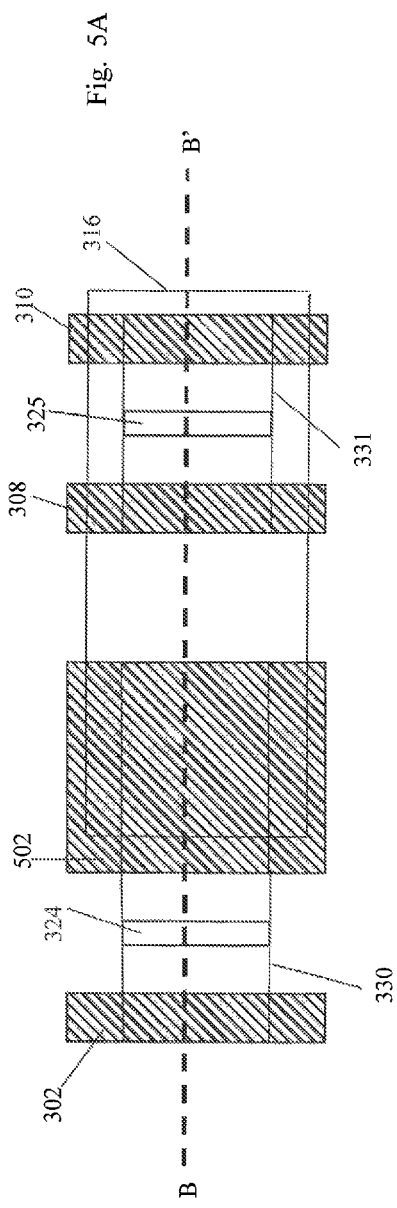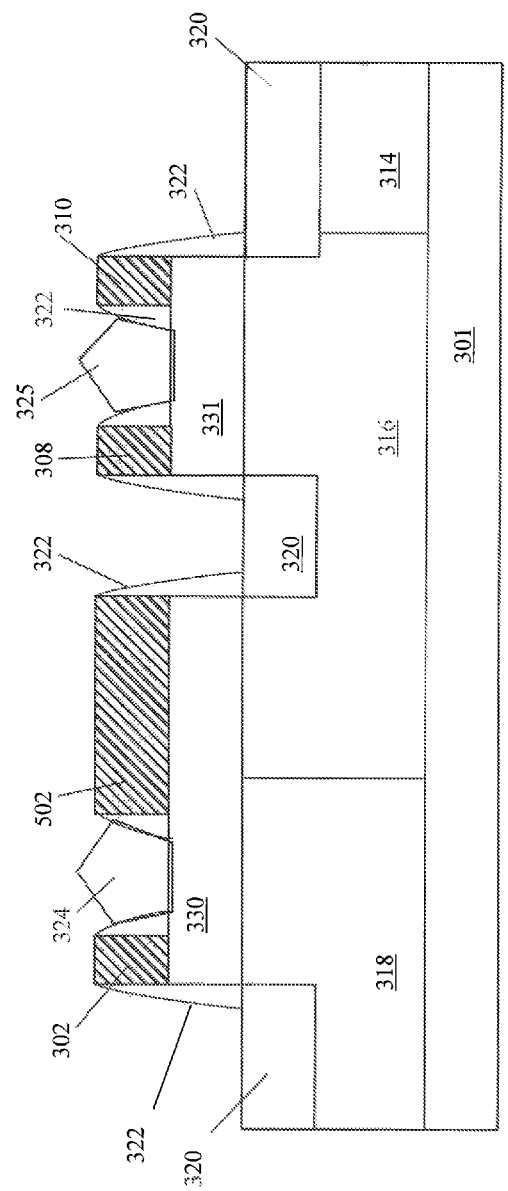

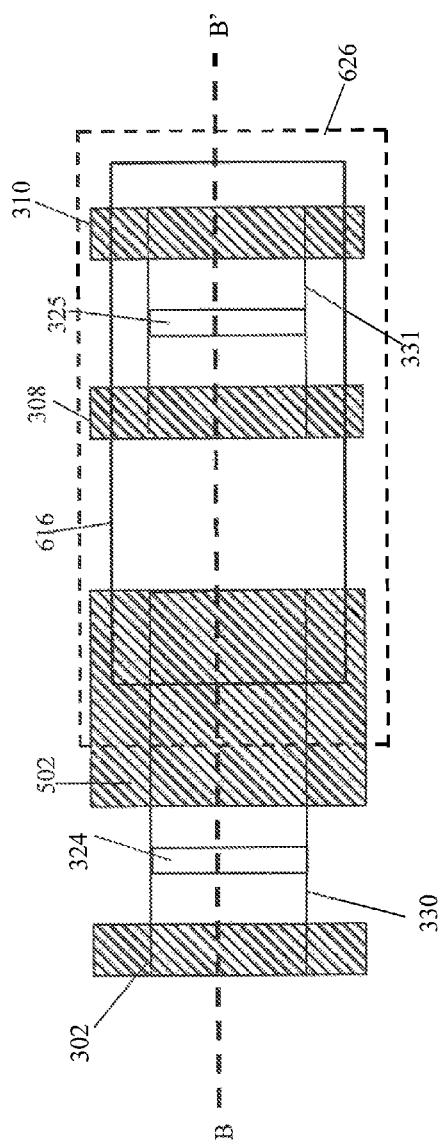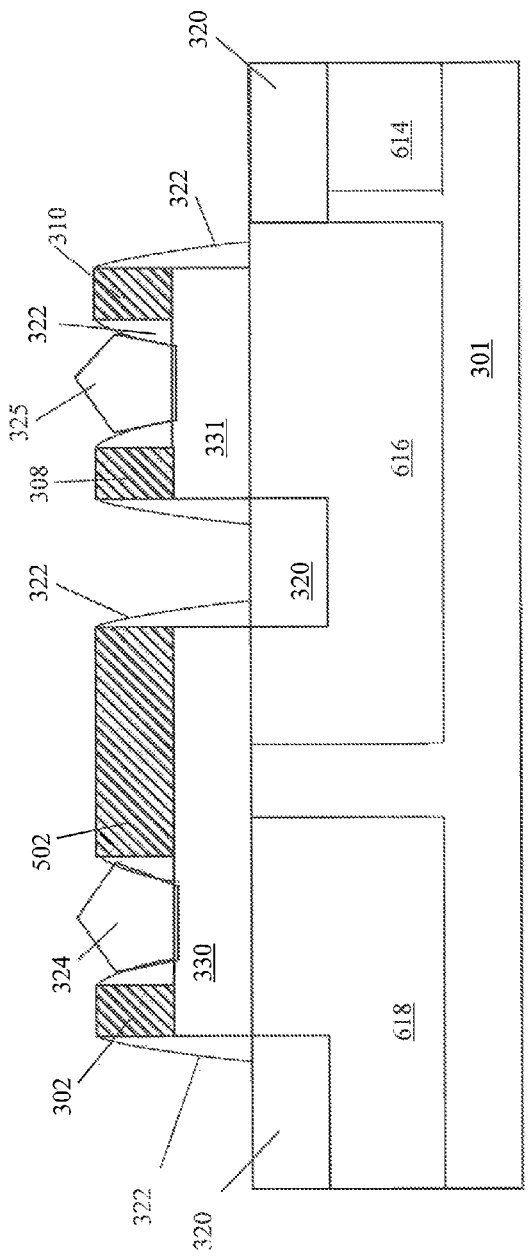

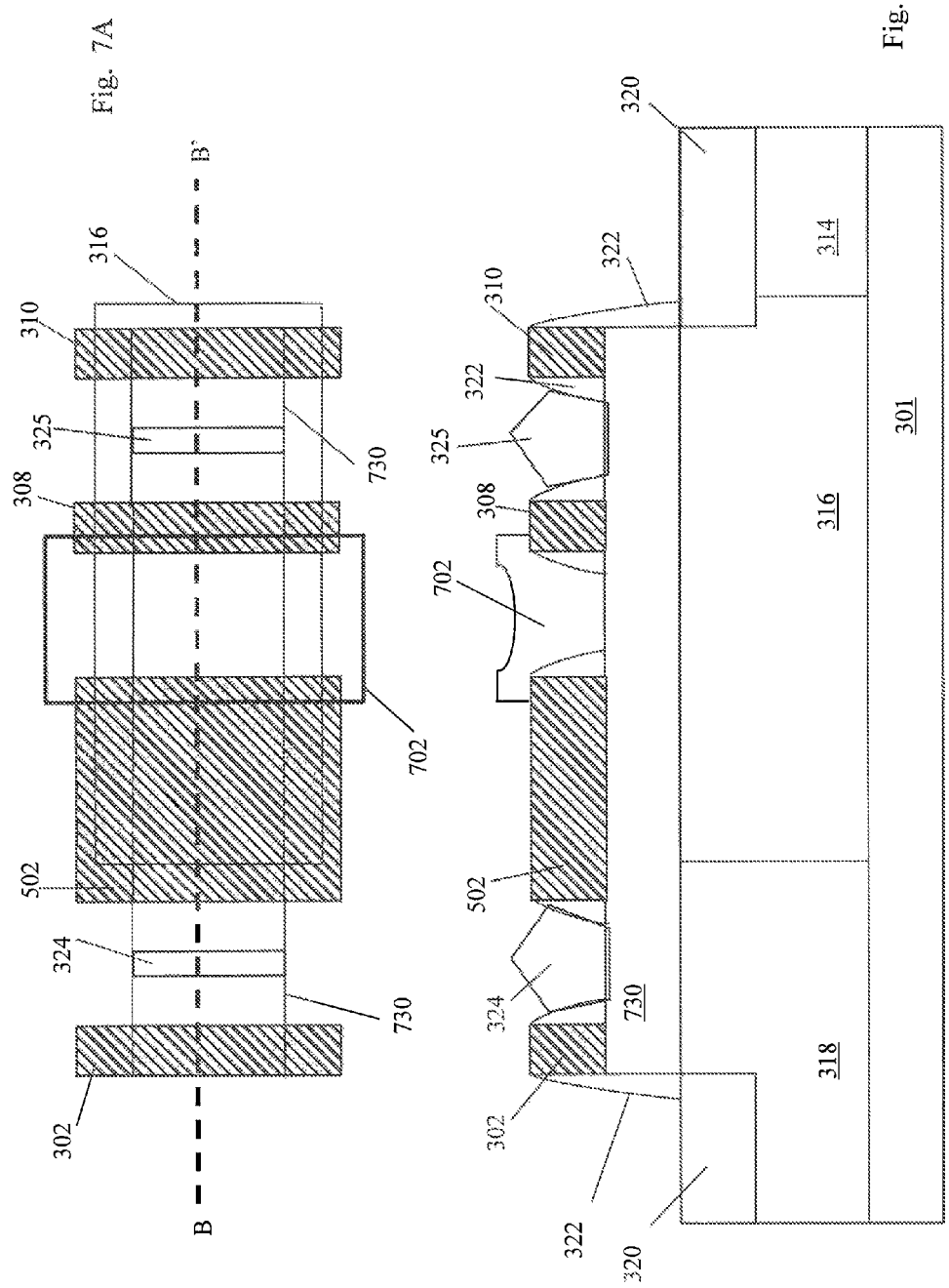

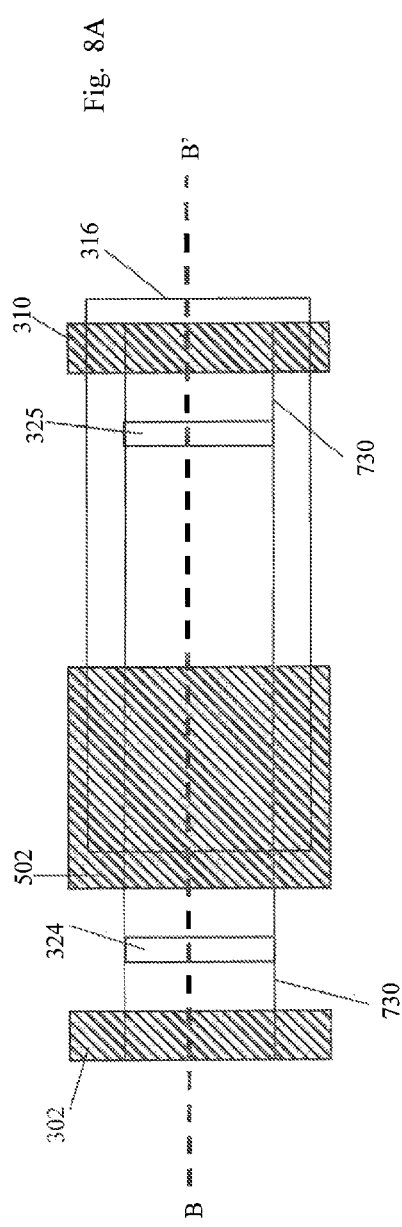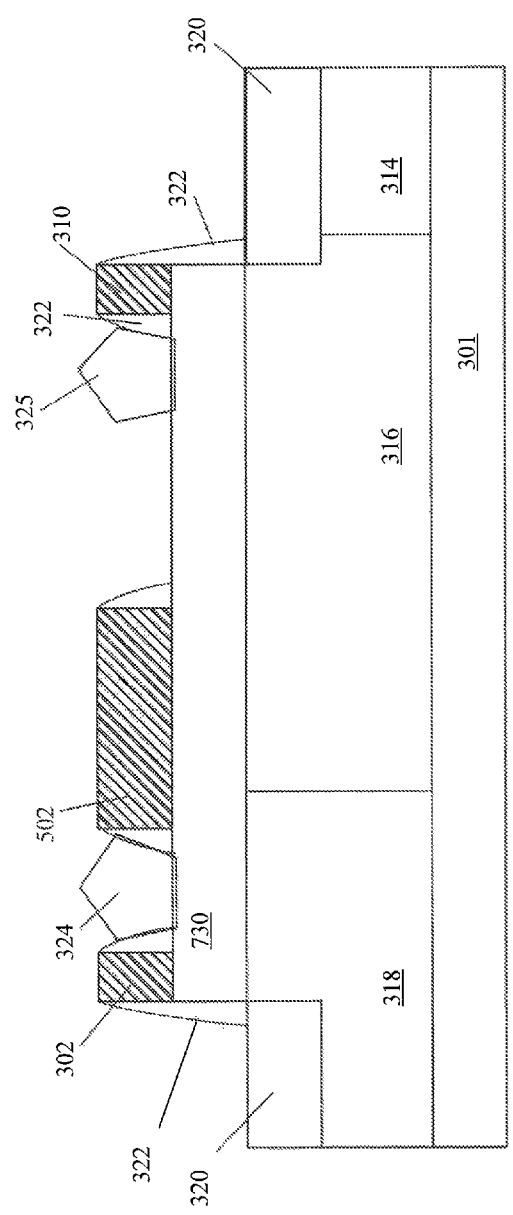

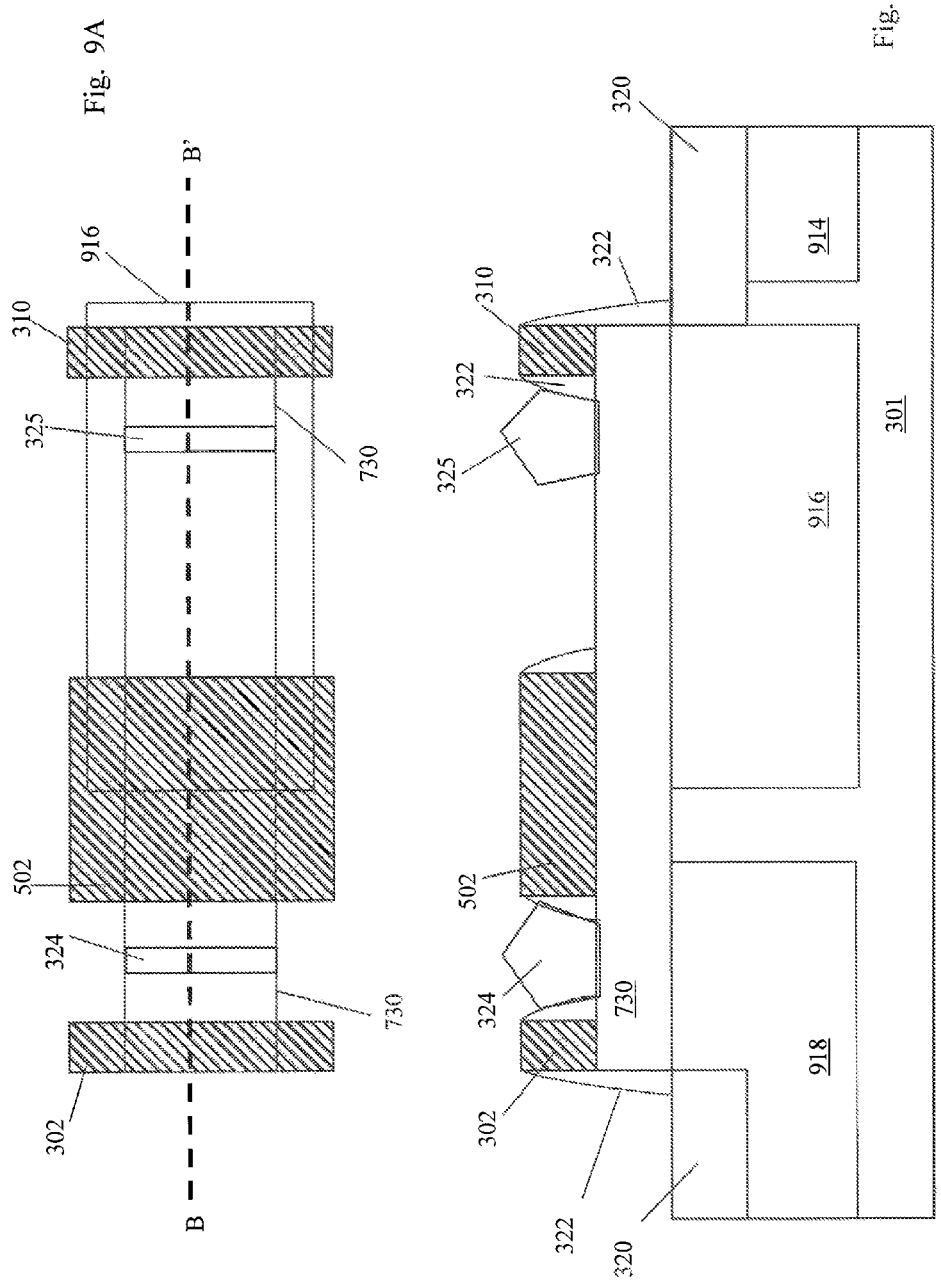

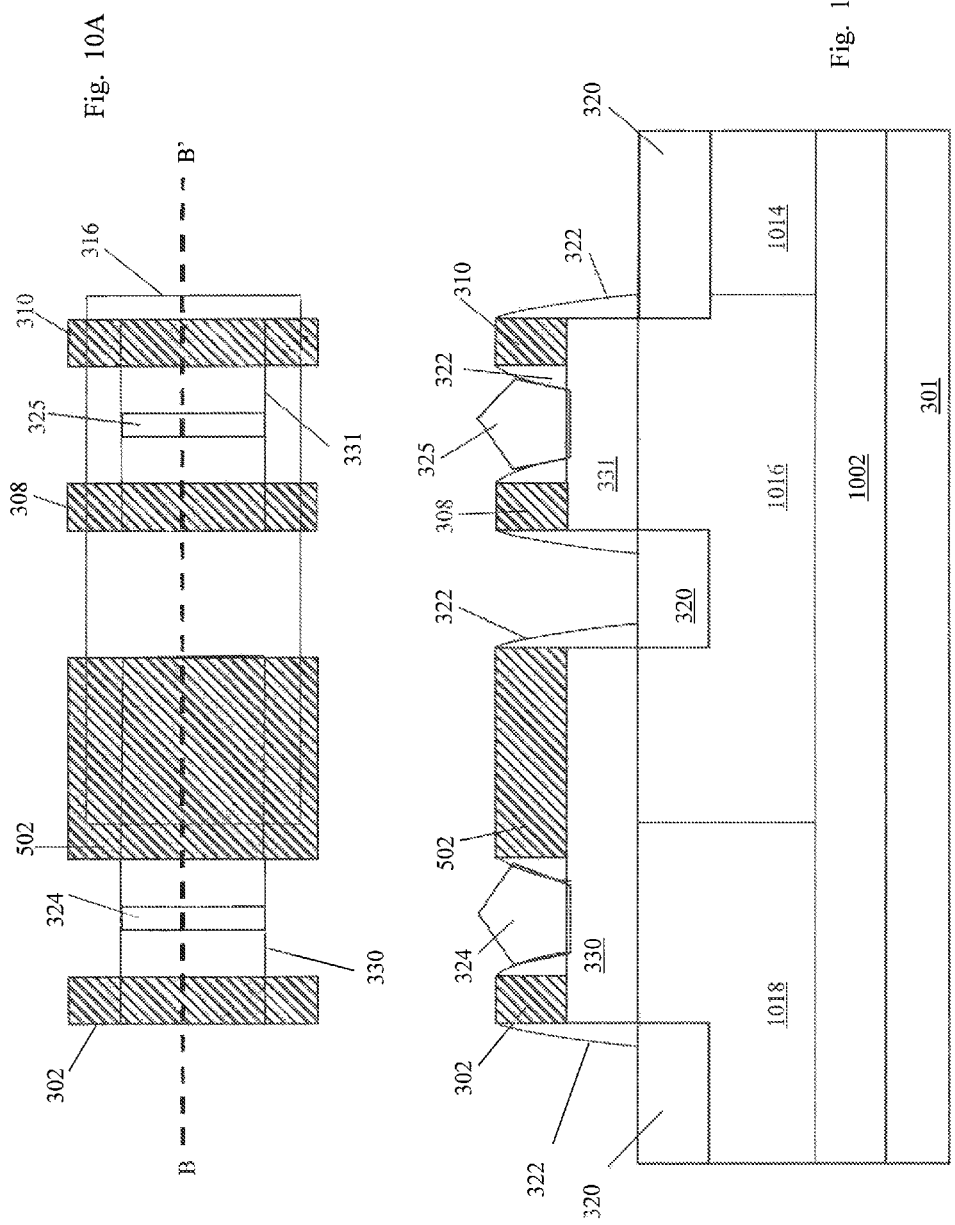

FIELD EFFECT TRANSISTOR STRUCTURE HAVING ONE OR MORE FINS

FIELD OF THE INVENTION

The present disclosure relates generally to the physical structure of the field effect transistor (FET), and processes for making same.

BACKGROUND

Advances in semiconductor manufacturing technologies have resulted in dramatically increased circuit packing densities and higher speeds of operation. In order to achieve such increased densities, a wide variety of evolutionary changes have taken place with respect to semiconductor processing techniques and semiconductor device structures over the years.

Many of these process and structural changes have been introduced in connection with device scaling, in which ever smaller device geometries have been achieved. One consequence of conventional FET device scaling is a requirement to reduce operating voltages. The reduced operating voltages are required, at least in part, because conventional FET device scaling needs a thinner gate dielectric layer in order to produce the desired electrical characteristics in the scaled-down transistor. Without a reduction in operating voltage, the electric field impressed across the thinner gate dielectric during circuit operation can be high enough for dielectric breakdown to become a problem.

Historically, FETs have been fabricated as planar devices. FIG. 1 shows a cross-section of an exemplary, conventional, planar, FET. But a vertically oriented device, referred to as a "finFET," has more recently been introduced into commercial semiconductor products. FIG. 2 illustrates the general arrangement of a conventional finFET.

FIG. 1 is a cross-sectional representation of a conventional planar FET. A gate dielectric layer 110 is disposed on the surface of a substrate 102. A gate electrode 108 is disposed on gate dielectric layer 110. Sidewall spacers 106 are disposed adjacent gate electrode 108 and gate dielectric layer 110. A first source/drain terminal 104, and a second source/drain terminal 112 are formed in substrate 102. First source/drain terminal 104 has a first source/drain extension 105, and second source/drain terminal 112 has a second source/drain extension 111. First and second source/drain terminals 104, 112 are symmetric with respect to gate 108.

FIG. 2 is an isometric view of an example of a conventional finFET. Substrate 202 has dielectric isolations areas 208 formed thereon adjacent to fin 204. A gate dielectric layer 214 and a gate electrode 212 together make up the conventional finFET gate structure. The gate structure "wraps" around the vertical and top sides of the fin. The source/drain terminals are those regions of fin 204 on either side of the gate electrode 212. In the conventional finFET, both source/drain terminals are adjacent to, and equidistant from gate electrode 212.

It has been recognized that many integrated circuit designs require both low operating voltage FETs for their ability to operate at high speeds, and high operating voltage FETs for their ability to interface with high voltage signals provided by other electronic components. In response to this need, manufacturers have developed and provided semiconductor manufacturing processes that offer two types of transistors for use within a single integrated circuit. These two types of transistors include a first type with low operating voltage and high speed, and a second type with a higher operating voltage and a lower speed.

Unfortunately, these semiconductor manufacturing processes do not provide finFETs with the electrical characteristics of high speed and high operating voltage combined in a single device.

BRIEF DESCRIPTION OF THE DRAWINGS

Various exemplary embodiments are described with reference to the accompanying drawings. In the drawings, like reference numbers indicate identical or functionally similar elements. Additionally, the left most digit(s) of a reference number identifies the drawing in which the reference number first appears.

FIG. 3A is a top view of a first exemplary embodiment of a finFET having an extended current path between source and drain terminals.

FIG. 3B is a cross-sectional view of the structure of FIG. 3A taken through line B-B'.

FIG. 4A is a top view of a second exemplary embodiment of a finFET having an extended current path between source and drain terminals.

FIG. 4B is a cross-sectional view of the structure of FIG. 4A taken through line B-B'.

FIG. 5A is a top view of a third exemplary embodiment of a finFET having an extended current path between source and drain terminals.

FIG. 5B is a cross-sectional view of the structure of FIG. 5A taken through line B-B'.

FIG. 6A is a top view of a fourth exemplary embodiment of a finFET having an extended current path between source and drain terminals.

FIG. 6B is a cross-sectional view of the structure of FIG. 6A taken through line B-B'.

FIG. 7A is a top view of a fifth exemplary embodiment of a finFET having an extended current path between source and drain terminals.

FIG. 7B is a cross-sectional view of the structure of FIG. 7A taken through line B-B'.

FIG. 8A is a top view of a sixth exemplary embodiment of a finFET having an extended current path between source and drain terminals.

FIG. 8B is a cross-sectional view of the structure of FIG. 8A taken through line B-B'.

FIG. 9A is a top view of a seventh exemplary embodiment of a finFET having an extended current path between source and drain terminals.

FIG. 9B is a cross-sectional view of the structure of FIG. 9A taken through line B-B'.

FIG. 10A is a top view of a eighth exemplary embodiment of a finFET having an extended current path between source and drain terminals.

FIG. 10B is a cross-sectional view of the structure of FIG. 10A taken through line B-B'.

Figure 1:
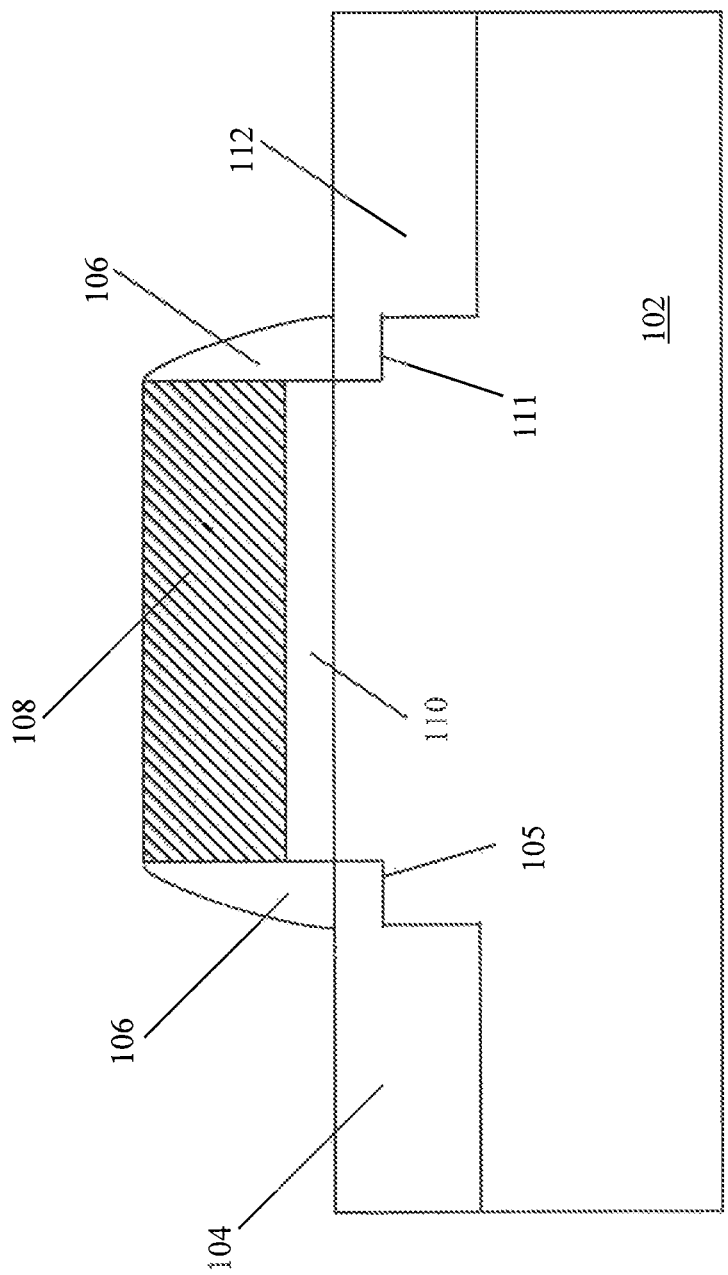
FIG. 1 is a cross-sectional representation of a conventional planar FET.
Figure 2:
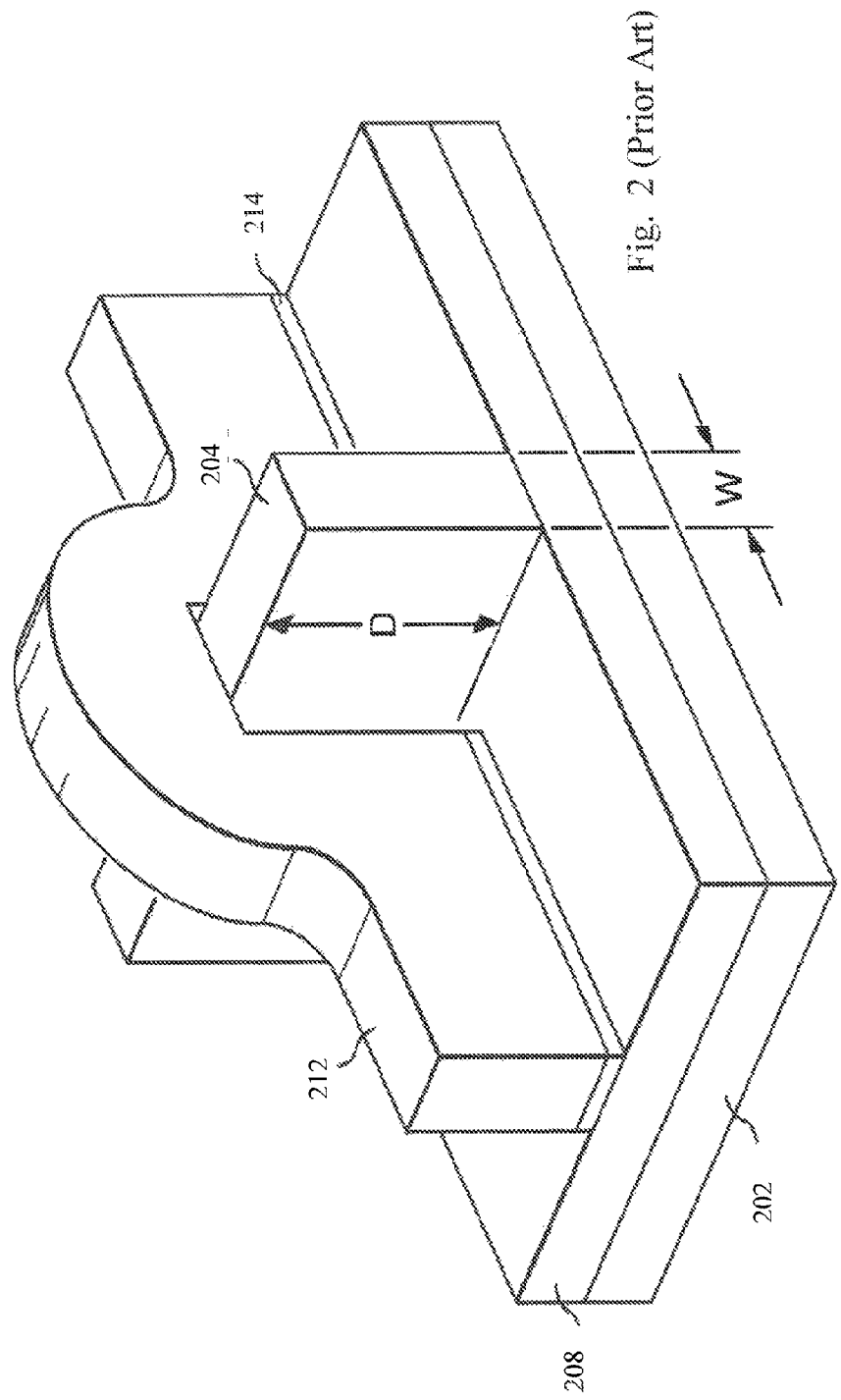
FIG. 2 is an isometric view of a conventional silicon-fin-based FET (finFET).

It is noted that the drawn representations of various semiconductor structures shown in the figures are not necessarily drawn to scale, but rather, as is the practice in this field, drawn to promote a clear understanding of the structures and process steps which they are illustrating.

DETAILED DESCRIPTION

The following Detailed Description refers to accompanying drawings to illustrate exemplary embodiments. References in the Detailed Description to "one exemplary embodiment," "an illustrative embodiment", "an exemplary embodiment," and so on, indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications may be made to the exemplary embodiments within the spirit and scope of the disclosure.

It is to be understood that the phraseology or terminology herein is for the purpose of description and not of limitation, such that the terminology or phraseology of the present specification is to be interpreted by those skilled in relevant art(s) in light of the teachings herein.

TERMINOLOGY

The terms, chip, die, integrated circuit (IC), semiconductor device, and microelectronic device, are often used interchangeably in the field of electronics.

With respect to chips, it is common that power, ground, and various signals may be coupled between them and other circuit elements via physical, electrically conductive connections. Such a point of connection may be referred to as an input, output, input/output (I/O), terminal, line, pin, pad, port, interface, or similar variants and combinations. Although connections between and amongst chips are commonly made by way of electrical conductors, those skilled in the art will appreciate that chips and other circuit elements may alternatively be coupled by way of, but not limited to, optical, mechanical, magnetic, electrostatic, and electromagnetic interfaces.

The terms metal line, trace, wire, interconnect, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as, but not limited to, aluminum (Al), copper (Cu), an alloy of Al and Cu, an alloy of Al, Cu and silicon (Si), tungsten (W), nickel (Ni), titanium nitride (TiN), and tantalum nitride (TaN) are conductors that provide signal paths for interconnecting electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), cobalt (Co), molybdenum (Mo), and refractory metal silicides are examples of other conductors.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly. It is noted that polysilicon is commonly used to form the gate electrode of a FET. An alternative use of polysilicon is as a sacrificial gate electrode that is removed and replaced with a metal gate during the manufacturing process.

Epitaxial layer refers to a layer of single crystal semiconductor material. In this field, an epitaxial layer is commonly referred to "epi."

FET, as used herein, refers to a metal-oxide-semiconductor field effect transistor (MOSFET). An n-channel FET is referred to herein as an NFET. A p-channel FET is referred to herein as a PFET. FETs that are formed in a bulk substrate, such as a silicon wafer, have four terminals, namely gate, drain, source and body.

Effective oxide thickness refers to the thickness of a layer of $SiO_2$ that is electrically equivalent to a given thickness of a material having a given dielectric constant. In many circumstances it is the electrical characteristic of a dielectric layer (which is proportional to layer thickness/dielectric constant) that is of interest rather than the actual physical thickness of the layer. Historically, the gate dielectric layer was formed almost exclusively from silicon dioxide, but that is no longer the case in the semiconductor industry. Since there are a variety of materials now in use as gate dielectrics, it is easier for the sake of comparison to discuss these gate dielectrics in terms of a normalized value such as effective oxide thickness. By way of example, since $HfO_2$ has a dielectric constant of 25 (compared to 3.9 for $SiO_2$), a 6.4 nm layer of $HfO_2$ has an effective oxide thickness of 1 nm. In other words, a layer of high dielectric constant material can be electrically equivalent to a thinner layer of lower dielectric constant material.

As used herein, "gate" refers to the insulated gate terminal of a FET. The physical structure of the gate terminal is referred to as a gate electrode. In terms of the layout of an integrated circuit, the gate electrode is the logical AND of the polysilicon layer with the layer representing an active portion of the semiconductor surface.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The terms contact and via, both refer to structures in a chip used for electrical connection of conductors from different interconnect levels of the chip. These terms are sometimes used in the art to describe both an opening in an insulator in which the structure will be completed, and the completed structure itself. For purposes of this disclosure, contact and via both refer to the completed structure.

Substrate, as used herein, refers to the physical object that is the basic workpiece transformed by various process operations into the desired microelectronic configuration. A typical substrate used for the manufacture of integrated circuits is a wafer. Wafers, may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is a very commonly used substrate for the manufacture of integrated circuits.

The term vertical, as used herein, means substantially perpendicular to the surface of a substrate.

Overview

At one time in the semiconductor industry it was common for a single entity, such as a corporation, to develop a semiconductor process, design integrated circuits in accordance with the physical and electrical characteristics of that process, and then manufacture those integrated circuits. However, as the cost of building, equipping, and operating semiconductor manufacturing facilities dramatically increased, fewer and fewer entities could afford to both design and manufacture integrated circuits. Because the costs of being a semiconductor manufacturer are so high, great economies of scale are required in order to operate profitably. Consequently, it is common today in the semiconductor industry, to find companies that manufacture but do not design integrated circuits ("foundries"), and companies that design integrated circuits but do not manufacture them ("fabless").

In the semiconductor industry environment of foundries and fabless companies, it is the foundries that develop, specify and provide the physical structures that designers use to implement their designs. Foundries provide manufacturing services to many fabless semiconductor companies, but to operate profitably, they must optimize their manufacturing processes to achieve high yields. Such optimizations typically require that limitations be placed on the variety of structures that can be produced by a particular manufacturing process. Consistent with the foregoing, foundries typically provide a limited set of transistor structures that are intended to cover a broad range of circuit applications. Unfortunately these limited sets of structures do not satisfy every need of integrated circuit designers.

There are many well-known transistor structures that are offered by the foundries. For example, PFETs and NFETs with high threshold voltage (Vt) or low Vt; thick gate dielectric or thin gate dielectric; and various combinations of the foregoing. It is further noted that transistor structures are often adapted for use in a "core" region of a chip, or in an "I/O" (Input/Output) or "peripheral" region of a chip. It is common for FETs used in the core region to have thin gate dielectric layers and to operate at low voltages, whereas it is common for FETs used in the I/O or peripheral regions to have relatively thicker gate dielectric layers and relatively higher operating voltages. Another distinction between core and I/O FETs is that the wells in which the I/O FETs are formed are more heavily doped than the wells in which core FETs are formed. This arrangement allows for high speed operations in the core and for interfacing with signals having higher voltages than can be handled by the low voltage FETs. As explained in greater detail below, some embodiments in accordance with the present disclosure take advantage of the manufacturing operations available in such existing processes to fabricate new transistor structures.

Disclosed herein are the structures of finFETs having a unique combination of properties, and methods of making those finFETs. A finFET, in accordance with the present disclosure, is operable to interface with relatively high voltage signals (similar to I/O transistors), and to simultaneously operate at high switching speeds (similar to core transistors). It is noted that $f_T$ refers to the frequency at which the small signal gain of the transistor drops to unity. In order to incorporate these two property sets into the same transistor, finFETs in accordance with the present disclosure include an extended current path between source and drain terminals. Further, the finFET structures in accordance with the disclosure can be fabricated concurrently with conventional CMOS finFET processing.

Exemplary Structures

The exemplary embodiments are compatible with the concurrent fabrication of conventional finFETs on the same chip.

FIG. 3A is a top view of a first exemplary embodiment of a finFET having an extended current path between source and drain terminals. This top view shows a single finFET constructed over two separate, co-linear fins 330, 331. Such an embodiment may be referred to as a two-fin embodiment. Each fin has two terminal ends, and each terminal end has a fin termination structure disposed thereon 302, 306, 308, 310. In the embodiment of FIG. 3A, no fin exists in the space between second fin termination structure 306 and third fin termination structure 308. A gate structure 304 is disposed on first fin 330 and a source terminal 324 is disposed on first fin 330 between first fin termination structure 302 and gate structure 304. Gate structures for finFETs in accordance with this disclosure include a gate dielectric layer and a gate electrode. The illustrated gate structures may remain in place as the final gate structures of the finFETs, or they may be removed and replaced with alternative gate dielectric and/or gate electrode materials. Gate replacement processes, for example high-k, metal gate (HKMG) are well-known in the semiconductor manufacturing field and are not further described herein.

Still referring to FIG. 3A, a drain terminal 325 is disposed on second fin 331 between third and fourth fin termination structures 308 and 310. An n-well 316 is disposed in the substrate on which the finFET is disposed. N-well 316 has a doping concentration between $1\times10^{17}/cm^3$ and $5\times10^{18}/cm^3$. In this illustrative embodiment, the terminals ends of fins 330, 331 are coextensive with the outer sidewalls of their respective fin termination structures 302, 306, 308, and 310.

FIG. 3B is a cross-sectional view of the structure of FIG. 3A taken through line B-B'. In this exemplary embodiment, a substrate 301 has a first p-well region 314 and a second p-well region 318 disposed in substrate 301. P-wells 318 and 314 have a concentration of dopants between $1\times10^{17}/cm^3$ and $5\times10^{18}/cm^3$. It is noted that first p-well region 314 and a second p-well region 318 may be discontiguous, or may in fact be part of a single larger, contiguous p-well region. An n-well region 316 is disposed in substrate 301 between first p-well region 314 and a second p-well region 318. Dielectric-filled recesses are disposed in substrate 301. These dielectric-filled recesses may be implemented as shallow trench isolation (STI) structures. In the exemplary embodiment of FIG. 3B, shallow trench isolation structures 320 are disposed in near-surface portions of first p-well region 314, second p-well region 318, and n-well region 316. In this embodiment first p-well region 314 abuts n-well region 316, and second p-well region 318 abuts n-well region 316. The location of boundary between an abutted n-well and p-well can be under a fin 330 or an STI structure 320.

Still referring to FIG. 3B, first fin 330 is disposed on substrate 301 and extends upwardly away from substrate 301 and is nominally vertical with respect to the upper surface of substrate 301. First fin 330 is disposed on substrate 301 such that a first portion is superjacent p-well 318 and a second portion is superjacent n-well 316. In this exemplary embodiment substrate 301 is a p-type wafer with a sheet resistivity between 8 Ω-cm and 15 Ω-cm. Second fin 331 is disposed on substrate 301 and extends upwardly away from substrate 301 and is nominally vertical with respect to the upper surface of substrate 301. Second fin 331 is disposed on substrate 301 such that it is superjacent n-well 316. First fin 330 and second fin 331 are disposed on substrate 301 such that they co-linear and laterally spaced apart. First fin termination structure 302 is disposed over a first terminal end of first fin 330 and a second fin termination structure 306 is disposed over a second terminal end of first fin 330. Gate structure 304 is disposed on first fin 330 such that it is between first fin termination structure 302 and second fin termination structure 306. Third fin termination structure 308 is disposed over a first terminal end of second fin 331. Fourth fin termination structure 310 is disposed over a second terminal end of second fin 331. Although fin termination structures 302, 306, 308, and 310 are shown in FIG. 3B as coinciding with the ends of their respective fins, in alternative embodiments, fin termination structures 302, 306, 308, and 310 can be extended beyond the end of the fins.

Sidewall spacers 322 are disposed adjacent sidewalls of first fin termination structure 302, second fin termination structure 306, active gate structure 304, third fin termination structure 308 and fourth fin termination structure 310. Source terminal 324 is disposed on first fin 330 between first fin termination structure 302 and gate structure 304. Gate structure 304 may be referred to as the "active" gate because during operation of a completed chip, gate structure 304 receives a signal that controls electrical conduction between source terminal 324 and drain terminal 325. Drain terminal 325 is disposed on second fin 331 between third fin termination structure 308 and fourth fin termination structure 310.

In operation, an electrical current may flow between drain terminal 325 and source terminal 324. The current path between drain terminal 325 and source terminal 324 includes second fin 331, n-well 316, p-well 318, and first fin 330.

Various exemplary embodiments are described below. In each of these exemplary embodiments, the current path between drain and source is extended compared to conventional finFET structures. In this way, finFETs in accordance with the disclosure may operate at higher voltages than conventional finFETs.

FIGS. 4A-4B illustrate an alternative structure that is similar to the structure illustrated by FIGS. 3A-3B, but which includes an additional epi structure 402 disposed on first fin 330 between gate structure 304 and second fin termination structure 306.

FIGS. 5A-5B illustrate an alternative structure that is similar to the structure illustrated by FIGS. 3A-3B, but which extends the active gate structure from the source terminal to the opposite end of the fin. A gate structure 502 is disposed on first fin 330 and extends laterally away from source terminal 324 to the end of fin 330 as shown.

FIGS. 6A-6B illustrate an alternative structure that is similar to the structure illustrated by FIGS. 5A-5B, but in which gaps between the p-well and n-well regions exist. FIG. 6B shows the spacing between n-well 616 and each of p-wells 614, 618. Those skilled in the art and having the benefit of this disclosure will recognize that p-wells 614, 618 can be implemented as a single larger p-well structure, and are not required to be separated into two or more separate p-wells. In FIG. 6A, a region 626 is defined by a box comprised of dashed lines. Region 626 is an area in which a p-well is not formed. Thus the interior portion of the dashed line box that is not occupied by n-well 616, represents the gaps between p-well 618 and n-well 616, and between n-well 616 and p-well 614.

FIGS. 7A-7B illustrate an alternative structure that is similar to the structure illustrated by FIGS. 6A-6B, except that the source terminal, active gate, and drain terminal are all disposed on a single common fin. Unlike the embodiment show in FIGS. 6A-6B, this exemplary embodiment includes only a single fin 730. This may be referred to as a "single-fin" embodiment. In the two-fin embodiments, the current path extended from the drain terminal through the second fin and into the well regions disposed in the substrate before passing through the first fin and into the source terminal. In the single-fin embodiment of FIGS. 7A-7B, the current between drain terminal 325 and source terminal 324 may pass through single fin 730. To prevent the introduction of various dopants into the portion of fin 730 between gate structure 502 and structure 308, a blocking mask is used during manufacturing to block ion implants. Such ion implants are typically performed during the semiconductor manufacturing process for N+ doping, P+ doping, formation of lightly doped drains, and for halo or pocket implants. FIGS. 7A and 7B show an implant blocking mask 702 used to block the undesired ion implants from this region of fin 730 during the manufacturing process. Implant blocking mask 702 is typically removed prior to completion of the manufacturing process.

FIGS. 8A-8B illustrate an alternative structure that is similar to the structure illustrated by FIGS. 7A-7B, except that structure 308 is removed. After the epitaxial growth of drain terminal 325, and after the need to block implants into fin 730, structure 308 is not required. In these single-fin embodiments, structure 308 is not acting as a fin termination structure but rather as a sacrificial structure that is useful for various manufacturing steps, but does not contribute to the electrical performance of the extended current path finFET. In this exemplary embodiment, structure 308 is removed once it is no longer needed to support the manufacturing process.

FIGS. 9A-9B illustrate an alternative structure that is similar to the structure illustrated by FIGS. 8A-8B, except that the p-wells and n-wells are spaced apart such that there are gaps therebetween. As shown in FIG. 9B, p-well 918 is spaced apart from n-well 916; and n-well 916 is spaced apart from p-well 914.

FIGS. 10A-10B illustrate an alternative structure that is similar to the structure illustrated by FIGS. 5A-5B, but with a reversal of the well conductivity types, and the addition of a deep n-well. In this exemplary embodiment, a deep n-well 1002 is disposed in substrate 301. In substrate 301, but above deep-n-well 1002, an n-well 1018, a p-well 1016 and an n-well 1014 are disposed. N-well 1018 and p-well 1016 are adjacent to, and abutting, each other. P-well 1016 and n-well 1014 are adjacent to, and abutting, each other. P-wells 1018 may be part of a larger single p-well. There is no requirement for these p-wells to be discontiguous.

Exemplary Processes

Figure 11:
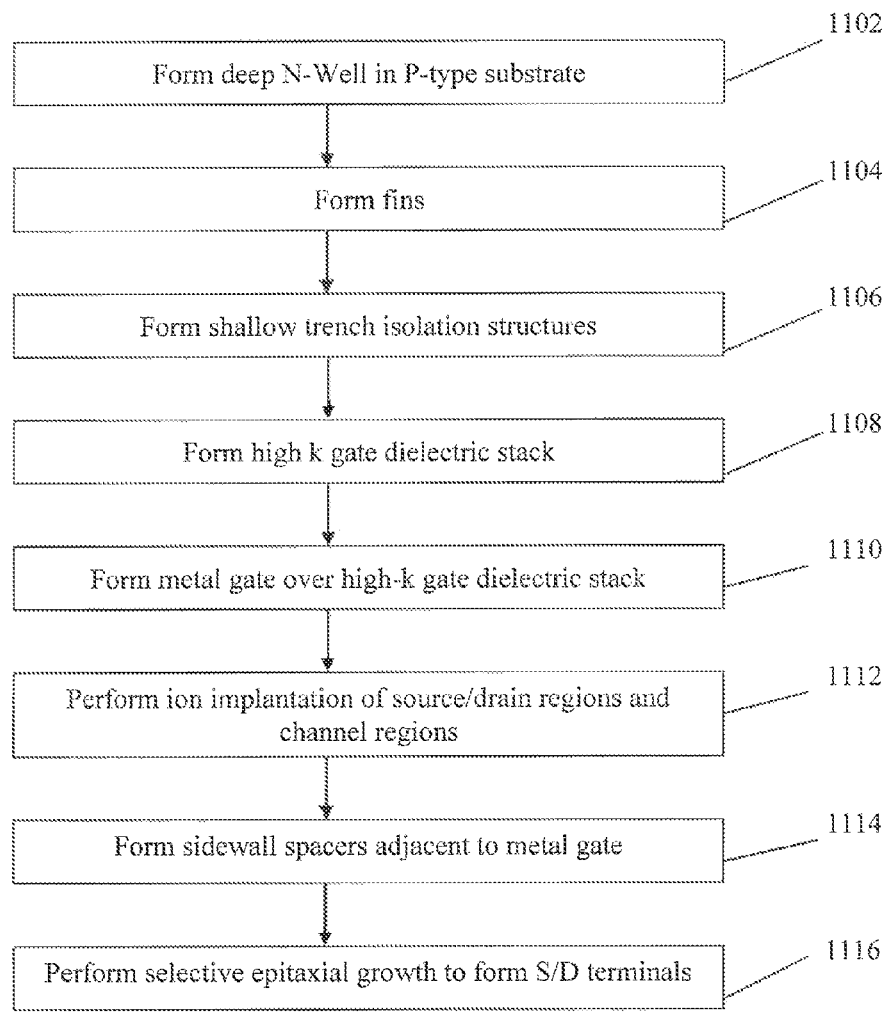
FIG. 11 is a flow diagram of an exemplary process of manufacturing a finFET having an extended current path.

FIG. 11 is a flow diagram of an exemplary process of fabricating an extended current path finFET in a manner that is compatible with the concurrent fabrication of conventional finFETs. At a step 1102, a deep n-well is formed in a p-type substrate. At a step 1104, a plurality of fins are formed such that they extend substantially vertically away from the surface of the substrate. At a step 1106, shallow trench isolation structures are formed. At a step 1108, a high-k dielectric stack is formed over the fins. At a step 1110, metal gate electrode structures are formed over the high-k gate dielectric stack. At a step 1112, source/drain extension implants and halo implants are performed. At a step 1114, sidewall spacers are formed adjacent to the metal gate electrode structures. At a step 1116, selective epitaxial growth is performed of regions of the fins to form source and drain terminals.

Figure 12:
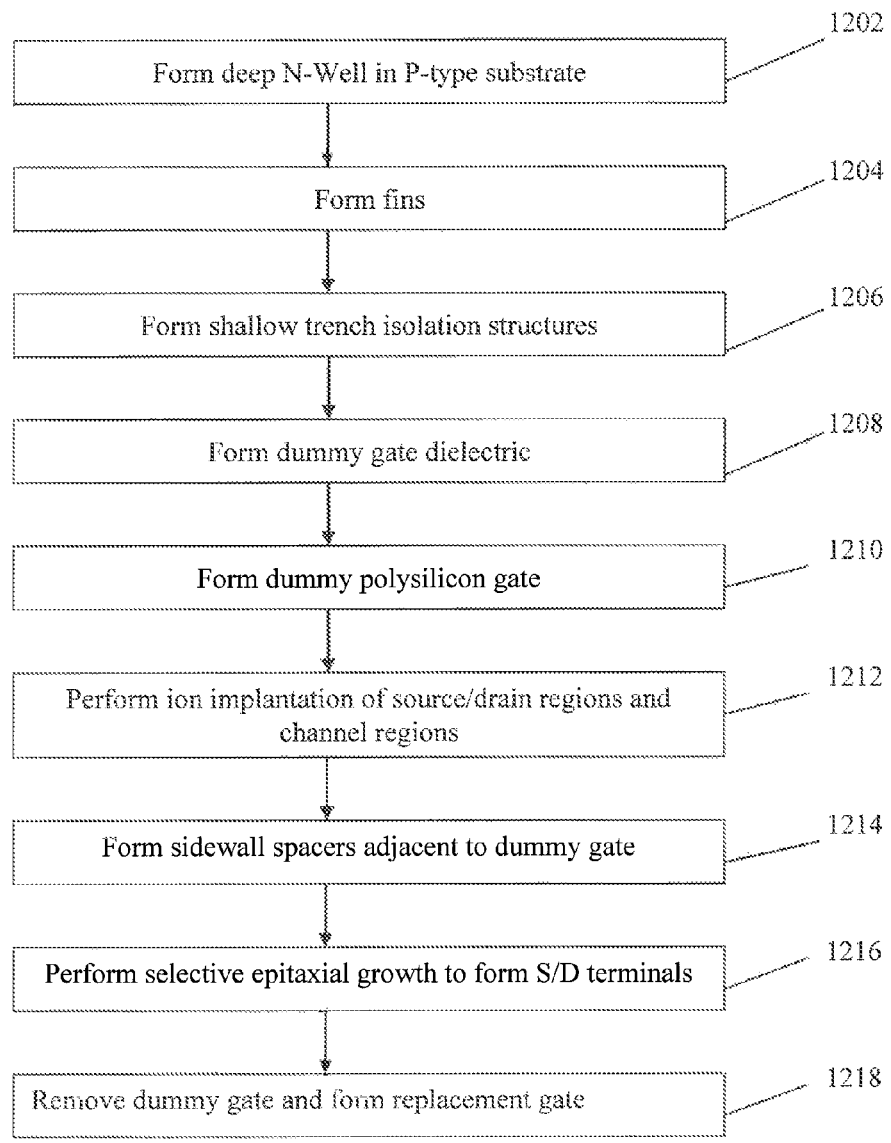
FIG. 12 is flow diagram of another exemplary process of manufacturing a finFET having an extended current path.

FIG. 12 is a flow diagram of an exemplary process of fabricating an extended current path finFET in a manner that is compatible with the concurrent fabrication of conventional finFETs. At a step 1202, a deep n-well is formed in a p-type substrate. At a step 1204, fins are formed such that they extend substantially vertically away from the surface of the substrate.

At a step 1206, shallow trench isolation structures are formed. At a step 1208, a dummy gate dielectric layer is formed over the fins. Another term for dummy in this context is "sacrificial." At a step 1210, dummy, or sacrificial, polysilicon gate electrodes are formed over the sacrificial gate dielectric layer. At a step 1212, source/drain extension and halo implants are performed. At a step 1214, sidewall spacers are formed adjacent to the sacrificial gate electrodes. At a step 1216, selective epitaxial growth is performed on the fins to form the raised source terminal and the raised drain terminal. At a step 1218, the sacrificial gate electrode and sacrificial gate dielectric are removed and a high-k gate dielectric and metal gate electrode are formed in their place.

In one illustrative structure, a finFET includes a first fin disposed on a first region of a substrate; a second fin disposed on a second region of the substrate, and spaced apart from the first fin; a gate structure disposed on the first fin; a first source/drain (S/D) terminal disposed on the first fin, adjacent to a first vertical side of the first gate structure; a second S/D terminal disposed on the second fin; wherein the first region of the substrate includes a first sub-region doped with a first concentration of dopant atoms of a first conductivity type, a second sub-region doped with a second concentration of dopant atoms of a second conductivity type, and the second region of the substrate includes a third sub-region doped with the second concentration of dopant atoms of the second conductivity type.

In another embodiment, a finFET includes a fin disposed on a substrate, the fin having a first end and a second end; a first fin termination structure disposed on the first end of the fin, and a second fin termination structure disposed on the second end of the fin; a source terminal disposed on the fin and adjacent to the first fin termination structure; a gate structure disposed on the fin and adjacent to the first S/D structure; a drain terminal disposed on the fin and spaced apart from the gate structure; a first well of a first conductivity type disposed under the source terminal and a first portion of the gate structure; and a second well of a second conductivity type disposed under a second portion of the gate structure and the drain terminal.

In still another embodiment, a process of fabricating a finFET includes the steps of forming p-wells and n-wells in a substrate such that at least one p-well abuts at least one n-well at a boundary; forming a first fin extending upwardly from the surface of the substrate in a substantially vertical direction, the first fin disposed over the boundary where p-well abuts a first n-well; forming a second fin, spaced apart from, and co-linear with, the first fin, the second fin extending upwardly from the surface of the substrate in a substantially vertical direction, the second fin disposed over the first n-well and a laterally away from the boundary; forming a shallow trench isolation structure in the surface of the substrate between the first fin and the second fin; forming a sacrificial gate dielectric layer over the first fin and the second fin; forming a sacrificial gate electrode layer of the first fin and the second fin; patterning the sacrificial gate electrode layer to form a first fin termination structure at a first end of the first fin, a second fin termination structure at a second end of the first fin, a third fin termination structure at a first end of the second fin, a fourth fin termination structure at the second end of the second fin, and a gate structure on the first fin between the first and second fin termination structures; forming sidewall spacers adjacent each of the first, second, third, and fourth fin termination structures and the gate structure; and epitaxially growing a source terminal on the first fin between the first fin termination structure and the gate structure, and epitaxially growing a drain terminal on the second fin between the third and fourth fin termination structures.

CONCLUSION

It is to be appreciated that the Detailed Description section, and not the Abstract of the Disclosure, is intended to be used to interpret the Claims. The Abstract of the Disclosure is not intended to limit the subjoined Claims in any way.

It will be apparent to those skilled in the relevant art(s) that various changes in form and detail can be made therein without departing from the spirit and scope of the disclosure. Thus the invention should not be limited by any of the above-described exemplary or illustrative embodiments, but should be defined in accordance with the subjoined Claims and their equivalents.

What is claimed is:

1. A transistor, comprising:
a first fin disposed on a first region of a substrate;
a second fin disposed on a second region of the substrate and spaced apart from the first fin;
a gate structure disposed on the first fin;
a first source/drain (S/D) terminal disposed on the first fin, adjacent to a first vertical side of the gate structure; and
a second S/D terminal disposed on the second fin;
wherein the first region of the substrate includes a first sub-region doped with a first concentration of dopant atoms of a first conductivity type, and a second sub-region doped with a second concentration of dopant atoms of a second conductivity type, and wherein the second region of the substrate includes a third sub-region doped with the second concentration of dopant atoms of the second conductivity type.

2. The transistor of claim 1, wherein the second sub-region and the third sub-region are contiguous.

3. The transistor of claim 2, further comprising a first fin termination structure disposed on the first fin, and a second fin termination structure disposed on the second fin.

4. The transistor of claim 1, wherein the first fin has a first end and a second end, the second fin has a first end and a second end; and the second end of the first fin faces, and is spaced apart from the first end of the second fin.

5. The transistor of claim 1, wherein the first conductivity type is p-type and the second conductivity type is n-type.

6. The transistor of claim 1, wherein the first concentration of dopant atoms is between $1\times10^{17}/cm^3$ and $5\times10^{18}/cm^3$.

7. The transistor of claim 1, wherein the second concentration of dopant atoms is between $1\times10^{17}/cm^3$ and $5\times10^{18}/cm^3$.

8. The transistor of claim 1, wherein the first fin has a first end and a second end, the second fin has a first end and a second end; the second end of the first fin faces, and is spaced apart from the first end of the second fin; and further comprising:
a first fin termination structure disposed on the first fin and aligned to the first end of the first fin;
a second fin termination structure disposed on the first fin and aligned to the second end of the first fin;
a third fin termination structure disposed on the second fin and aligned to the first end of the second fin;
a fourth fin termination structure disposed on the second fin and aligned to the second end of the second fin; and
a shallow trench isolation structure disposed in a recess in the surface of the substrate between the second end of the first fin and the first end of the second fin.

9. The transistor of claim 1, wherein the first S/D terminal comprises epitaxial silicon and the second S/D terminal comprises epitaxial silicon.

10. The transistor of claim 8, further comprising an epitaxial silicon structure disposed on the first fin between the gate structure and the second fin termination structure.

11. The transistor of claim 1, wherein the first fin has a first end and a second end, the second fin has a first end and a second end; the second end of the first fin faces, and is spaced apart from the first end of the second fin; and further comprising:
- a first fin termination structure disposed on the first fin and aligned to the first end of the first fin;
- a third fin termination structure disposed on the second fin and aligned to the first end of the second fin; and
- a fourth fin termination structure disposed on the second fin and aligned to the second end of the second fin;
- wherein the gate structure extends from the first source/drain terminal to the second end of the first fin.

* * * * *

UNITED STATES PATENT AND TRADEMARK OFFICE
CERTIFICATE OF CORRECTION

PATENT NO. : 9,105,724 B2
APPLICATION NO. : 14/030569
DATED : August 11, 2015
INVENTOR(S) : Akira Ito It is certified that error appears in the above-identified patent and that said Letters Patent is hereby corrected as shown below:

On the Title Page, in the Abstract, Item 57, Line 9. Please replace "fin. the" with --fin. The--.

In the Specification

Column 10, Line 52. Please replace "apart from the" with --apart from, the--.

Column 11, Line 7. Please replace "apart from the" with --apart from, the--.

Signed and Sealed this
Twenty-first Day of June, 2016

Michelle K. Lee
*Director of the United States Patent and Trademark Office*